(12) United States Patent
Hong et al.

(10) Patent No.: US 11,316,088 B2
(45) Date of Patent: Apr. 26, 2022

(54) REFLECTIVE AND HEAT-INSULATING QLED PACKAGE DEVICE AND METHOD FOR PACKAGING THE SAME AS WELL AS LUMINAIRE

(71) Applicant: Tianjin Zhonghuan Electronic Lighting Technology Co., Ltd., Tianjin (CN)

(72) Inventors: Jianming Hong, Tianjin (CN); Chunfeng Li, Tianjin (CN); Xiumei Tang, Tianjin (CN); Dong Li, Tianjin (CN)

(73) Assignee: Tianjin Zhonghuan Electronic Lighting Technology Co., Ltd., Tianjin (CN)

( * ) Notice: Subject to any disclaimer, the term of this patent is extended or adjusted under 35 U.S.C. 154(b) by 655 days.

(21) Appl. No.: 16/322,137

(22) PCT Filed: Nov. 1, 2018

(86) PCT No.: PCT/CN2018/113518
§ 371 (c)(1),
(2) Date: Jan. 31, 2019

(87) PCT Pub. No.: WO2020/006948
PCT Pub. Date: Jan. 9, 2020

(65) Prior Publication Data
US 2021/0367126 A1    Nov. 25, 2021

(30) Foreign Application Priority Data
Jul. 4, 2018  (CN) .......................... 201810733427.0

(51) Int. Cl.
*H01L 33/64*    (2010.01)
*H01L 25/075*   (2006.01)
(Continued)

(52) U.S. Cl.
CPC ........ *H01L 33/644* (2013.01); *H01L 25/0753* (2013.01); *H01L 33/507* (2013.01);
(Continued)

(58) Field of Classification Search
CPC ......... H01L 21/76846; H01L 21/76829; H01L 23/481; H01L 23/53276; H01L 29/4236
See application file for complete search history.

(56) References Cited

U.S. PATENT DOCUMENTS

| 8,748,922 B2 | 6/2014 | Van Herpen et al. |
| 2006/0055309 A1* | 3/2006 | Ono ..................... H01L 25/0753 313/492 |

(Continued)

FOREIGN PATENT DOCUMENTS

| CN | 101795860 A | 8/2010 |
| CN | 103296174 A | 9/2013 |

(Continued)

OTHER PUBLICATIONS

Chinese First Search Priority Document, Application No. 2018107334270.
(Continued)

*Primary Examiner* — Herve-Louis Y Assouman
(74) *Attorney, Agent, or Firm* — MacMillan, Sobanski & Todd, LLC (57) ABSTRACT

A reflective and heat-insulating QLED package device and a method for packaging the same as well as a luminaire are provided. The reflective and heat-insulating QLED package device includes a substrate, a first LED chip for emitting blue light, a second LED chip for emitting green light, an adhesive layer for quantum dots, a reflecting layer for changing the path of light rays, and a heat-insulating layer. The first LED chip and the second LED chip are arranged on the substrate in a tiled manner. The heat-insulating layer is (Continued)

arranged on the light output surface of the first LED chip and the second LED chip, a reflecting layer covers the heat-insulating layer, and a reflecting substance or a refractive substance is uniformly distributed in the reflecting layer. The adhesive layer for quantum dots covers the reflecting layer and is covered by a moisture and oxygen blocking adhesive layer.

20 Claims, 3 Drawing Sheets

(51) Int. Cl.
   *H01L 33/50* (2010.01)
   *H01L 33/60* (2010.01)
   *B82Y 20/00* (2011.01)
   *B82Y 40/00* (2011.01)

(52) U.S. Cl.
   CPC ............ *H01L 33/508* (2013.01); *H01L 33/60* (2013.01); *H01L 33/641* (2013.01); *B82Y 20/00* (2013.01); *B82Y 40/00* (2013.01); *H01L 2933/0041* (2013.01); *H01L 2933/0058* (2013.01); *H01L 2933/0075* (2013.01); *H01L 2933/0091* (2013.01)

(56) References Cited

U.S. PATENT DOCUMENTS

| | | | | |
|---|---|---|---|---|
| 2009/0001390 | A1* | 1/2009 | Yan | H01L 33/56 257/89 |
| 2011/0001157 | A1* | 1/2011 | McKenzie | H01L 33/507 257/98 |
| 2011/0241539 | A1* | 10/2011 | Yan | H01L 51/5284 313/504 |
| 2011/0291143 | A1* | 12/2011 | Kim | H01L 33/60 257/98 |
| 2014/0346547 | A1* | 11/2014 | Park | H01L 33/507 257/98 |
| 2018/0351034 | A1* | 12/2018 | Kuo | H01L 33/06 |
| 2018/0375055 | A1* | 12/2018 | Tu | H05K 7/20963 |
| 2021/0367126 | A1 | 11/2021 | Hong et al. | |

FOREIGN PATENT DOCUMENTS

| | | |
|---|---|---|
| CN | 103456866 A | 12/2013 |
| CN | 104124325 A | 10/2014 |
| CN | 104733591 A | 6/2015 |
| CN | 107302048 A | 10/2017 |
| CN | 207097818 U | 3/2018 |
| CN | 108695421 A | 10/2018 |
| CN | 208478373 U | 2/2019 |
| JP | 2018053202 A | 4/2018 |

OTHER PUBLICATIONS

The State Intellectual Property Office of People's Republic China, First Office Action, Application No. 201810733427.0, dated Mar. 22, 2019.

The State Intellectual Property Office of People's Republic China, Second Office Action, Application No. 201810733427.0.

International Search Report, Application No. PCT/CN2018/113518, dated Mar. 3, 2019.

International Written Opinion, Application No. PCT/CN2018/1135185, dated Apr. 10, 2019.

* cited by examiner

REFLECTIVE AND HEAT-INSULATING QLED PACKAGE DEVICE AND METHOD FOR PACKAGING THE SAME AS WELL AS LUMINAIRE

PRIORITY

This application is a U.S national application of the international application number PCT/CN2018/113518 filed on Nov. 1, 2018 and claiming priority of CN national application 201810733427.0 filed on Jul. 4, 2018 the contents of all of which are incorporated herein by reference.

TECHNICAL FIELD

The present disclosure relates to the technical field of LED package, and particularly to a reflective and heat-insulating QLED package device and a method for packaging the same as well as a luminaire.

BACKGROUND ART

In recent years, as backlights module used in liquid crystal display devices such as televisions and monitors, the use of LEDs (Light Emitting Diodes) has been rapidly developed. LED is a kind of semiconductor diodes, and is a photoelectric element which emits light relying on the unilateral conductivity of a semiconductor PN junction. When a forward voltage is applied to the light emitting diode, electron holes injected from the P-region into the N-region and electrons injected from the N-region into the P-region are respectively recombined with electrons in the N-region and holes in the P-region within a range of several micrometers around the PN junction, hereby generating fluorescence of spontaneous radiation. The energy states of electrons and electron holes in different semiconductor materials are different, and the amount of energy released by recombination of electrons and electron holes is also different, wherein the more energy is released, the shorter the wavelength of emitted light is, and accordingly, the light color of LEDs can be selected.

As for a white LED commonly used in a backlight module, a voltage is usually applied to a blue-light single crystal wafer (LED wafer) to emit blue light, then yellow light with a wavelength of 555 nm is generated by irradiating YAG yellow fluorescent powder, and macroscopic white light can be obtained just by complementarily mixing the yellow light with the blue light. The light emitted by the excited fluorescent powder has a relatively wide peak width at half height (80-130 nm), which results in that an LED according to the prior art has a color gamut coverage of about 72% NTSC in CIE1931 when being used as a backlight source, and the color rendition capability of liquid crystal displays such as televisions and monitors is relatively poor. In addition, since the light filter in the liquid crystal display device has a selective transmittance on red light, green light, or blue light, light in other wave bands except for partial red light, green light or blue light cannot pass through, resulting in partial light loss of an existing LED device packaged with yellow fluorescent powder, in which leads to a reduction of the light output efficiency of the backlight module.

SUMMARY

An object of the present disclosure is to provide a reflective and heat-insulating QLED (Quantum Dot Light Emitting Diode) package device and a method for packaging the same as well as a luminaire, so as to improve the color rendering effect of LEDs existing in the prior art.

A first aspect of an embodiment of the present disclosure provides a reflective and heat-insulating QLED package device, comprising a substrate, a first LED chip for emitting blue light, a second LED chip for emitting green light, an adhesive layer for quantum dots, a reflecting layer for changing the path of light rays, and a heat-insulating layer. The first LED chip and the second LED chip are both arranged on the substrate in a tiled manner, and the distance between the first LED chip and the second LED chip is in a range of 150-200 μm. The heat-insulating layer is arranged on the substrate, and the first LED chip and the second LED chip are both covered by the reflecting layer. The reflecting layer covers the heat-insulating layer and a reflecting substance is uniformly distributed in the reflecting layer, such that light rays can uniformly irradiate on the adhesive layer for quantum dots. The adhesive layer for quantum dots covers the reflecting layer. The adhesive layer for quantum dots is covered by a moisture and oxygen blocking adhesive layer for protecting quantum dots.

Optionally, the heat-insulating layer comprises a silicone material layer and microparticles of a reflecting substance or a refractive substance that are uniformly distributed in the silicone material layer.

Optionally, particles of a heat-conducting substance are further uniformly distributed in the reflecting layer.

Optionally, the adhesive layer for quantum dots comprises a dense region of quantum dots and a sparse region of quantum dots, with the regions in a stacked structure, wherein the quantum dot density in the dense region of quantum dots is greater than the quantum dot density in the sparse region of quantum dots, and the dense region of quantum dots is located at the side of the adhesive layer for quantum dots adjacent to the heat-insulating layer.

Optionally, particles of a heat-conducting substance are uniformly distributed in the adhesive layer for quantum dots.

Optionally, the first LED chip is welded to the substrate via the bottom of the first LED chip; and/or the second LED chip is welded to the substrate via the bottom of the second LED chip.

Optionally, the diameters of the microparticles of the reflecting substance are set to be between 0.1-1 μm, and the diameters of the microparticles of the refracting substance are set to be between 1-30 μm.

Optionally, the substrate is further provided with a reflector cup, which is arranged at the periphery of the heat-insulating layer and the reflecting layer in a surrounding way.

Optionally, the top of the reflector cup is provided with a junction board.

Optionally, the junction board is provided with a transparent bracket.

Optionally, a mounting groove is provided on an inner wall of the transparent bracket.

Optionally, glue-injection holes are provided on side walls of the transparent bracket respectively.

A second aspect of an embodiment of the present disclosure provides a reflective and heat-insulating QLED package device, comprising a substrate, a first LED chip for emitting blue light, a second LED chip for emitting green light, an adhesive layer for quantum dots, a reflecting layer for changing the path of light rays, and a heat-insulating layer. The first LED chip and the second LED chip are both arranged on the substrate in a tiled manner, and the distance between the first LED chip and the second LED chip is in a range of 150-500 µm. The heat-insulating layer is arranged on the light output surface of the first LED chip and the light output surface of the second LED chip, both the first LED chip and the second LED chip are covered by the reflecting layer, the reflecting layer covers the heat-insulating layer, and a reflecting substance or a refractive substance is uniformly distributed in the reflecting layer; and particles of a heat-conducting substance are further uniformly distributed in the reflecting layer, such that light rays can uniformly irradiate the adhesive layer for quantum dots. The adhesive layer for quantum dots covers the reflecting layer. The adhesive layer for quantum dots is covered by a moisture and oxygen blocking adhesive layer for protecting quantum dots.

Optionally, the heat-insulating layer comprises a silicone material layer and microparticles of a reflecting substance or a refractive substance that are uniformly distributed in the silicone material layer.

Optionally, the adhesive layer for quantum dots comprises a dense region of quantum dots and a sparse region of quantum dots, with the regions in a stacked structure, wherein the quantum dot density in the dense region of quantum dots is greater than the quantum dot density in the sparse region of quantum dots, and the dense region of quantum dots is located at the side of the adhesive layer for quantum dots adjacent to the heat-insulating layer.

Optionally, particles of a heat-conducting substance are uniformly distributed in the adhesive layer for quantum dots.

Optionally, the first LED chip is welded to the substrate via the bottom of the first LED chip; and/or the second LED chip is welded to the substrate via the bottom of the second LED chip.

Optionally, the diameters of the microparticles of the reflecting substance are between 0.1-1 µm; and the diameters of the microparticles of the refractive substance are between 1-30 µm. Optionally, the substrate is further provided with a reflector cup, which is arranged at the periphery of the heat-insulating layer and the reflecting layer in a surrounding way.

Optionally, the top of the reflector cup is provided with a junction board.

Optionally, the junction board is provided with a transparent bracket.

Optionally, a mounting groove is provided on an inner wall of the transparent bracket.

Optionally, glue-injection holes are provided on side walls of the transparent bracket respectively.

A third aspect of an embodiment of the present disclosure provides a method for packaging a reflective and heat-insulating QLED package device, comprising the steps of: covering the light output surface of a first LED chip and a the light output surface of second LED chip using a heat-insulating layer; arranging the first LED chip and the second LED chip on a substrate in a tiled manner; providing a reflecting layer on the substrate provided with the heat-insulating layer, wherein a reflecting substance is uniformly distributed in the reflecting layer; providing an adhesive layer for quantum dots on the reflecting layer; and providing a moisture and oxygen blocking adhesive layer on the adhesive layer for quantum dots, such that the moisture and oxygen blocking adhesive layer covers the adhesive layer for quantum dots.

Optionally, the heat-insulating layer comprises a silicone material layer and microparticles of a reflecting substance or a refractive substance that are uniformly distributed in the silicone material layer.

Optionally, particles of a heat-conducting substance are further uniformly distributed in the reflecting layer.

Optionally, after the step of providing an adhesive layer for quantum dots on the reflecting layer, the method further comprises the step of: making the substrate provided with the adhesive layer for quantum dots subject to a centrifugal operation, such that a dense region of quantum dots and a sparse region of quantum dots, in a stacked structure, are formed on the adhesive layer for quantum dots, wherein the dense region of quantum dots is located at the side adjacent to the heat-insulating layer.

Optionally, particles of a heat-conducting substance are uniformly distributed in the adhesive layer for quantum dots.

Optionally, the heat-insulating layer on the substrate is formed by an injection-molding process or a film spraying process; and the reflecting layer, the adhesive layer for quantum dots and the moisture and oxygen blocking adhesive layer are formed by a glue dispensing or a spraying process.

A fourth aspect of an embodiment of the present disclosure provides a luminaire, comprising a reflective and heat-insulating QLED package device according to any item of the foregoing first aspect and a luminaire body, wherein the reflective and heat-insulating QLED package device is mounted on the luminaire body.

A fifth aspect of an embodiment of the present disclosure provides a luminaire, comprising a reflective and heat-insulating QLED package device according to any item of the foregoing second aspect and a luminaire body, wherein the reflective and heat-insulating QLED package device is mounted on the luminaire body.

The beneficial effects of the embodiments of the present disclosure comprise:

The embodiments of the present disclosure provide a reflective and heat-insulating QLED package device and a method for packaging the same as well as a luminaire, wherein the reflective and heat-insulating QLED package device comprises a substrate, a first LED chip for emitting blue light, a second LED chip for emitting green light, an adhesive layer for quantum dots for emitting red light, a reflecting layer for changing the path of light rays, and a heat-insulating layer; the first LED chip and the second LED chip are both arranged on the substrate in a tiled manner, and the distance between the first LED chip and the second LED chip is in a range of 150-500 µm; the heat-insulating layer is arranged on the light output surface of the first LED chip and the light output surface of the second LED chip, both the first LED chip and the second LED chip are covered by the reflecting layer, the reflecting layer covers the heat-insulating layer, and a reflecting substance is uniformly distributed in the reflecting layer, such that light rays can uniformly irradiate the adhesive layer for quantum dots, and particles of a heat-conducting substance are further uniformly distributed in the reflecting layer; the adhesive layer for quantum dots covers the reflecting layer; and the adhesive layer for quantum dots is covered by a moisture and oxygen blocking adhesive layer for protecting quantum dots. A part of the blue light emitted by the first LED chip and a part of the green light emitted by the second LED chip excites quantum dots to emit red light, and white light emerges after that the red light is mixed with the blue light emitted by the first LED chip and the green light emitted by the second LED chip. Because of such mode of white light emergence, the arrangement of a fluorescent powder layer with relatively wider emission spectrum is cancelled in the structure of the package device, and the overall service life of the LED package device is improved, while the color rendition effect of the LED package device as backlight source is increased. The arrangement of covering the first LED chip and the second LED chip with the heat-insulating layer effectively blocks the heat produced by the LED chips during the light emission process from transferring to the adhesive layer for quantum dots; the light output from the first LED chip and the second LED chip is subjected to dodging and diverging processing by the reflecting layer, such that the density of light received by the adhesive layer for quantum dots is relatively well-balanced; and uniformly distributed particles of a heat-conducting substance enable the reflecting layer to be endowed with a heat dissipation function, and provide the heat produced by the excited adhesive layer for quantum dots 400 with a heat transfer channel to the substrate 100, hereby improving the excitation stability of the quantum dots and enhancing the reliability of the LED package device. The method for packaging a reflective and heat-insulating QLED package device provided in an embodiment of the present disclosure can avoid the arrangement of a fluorescent powder layer with relatively wider emission spectrum and increase the color rendition effect of the LED package device as a backlight source; and with the arrangement of a moisture and oxygen blocking adhesive layer for covering the adhesive layer for quantum dots, the activity of the quantum dots in the adhesive layer for quantum dots is ensured, and the service life of the LED package device is increased.

A luminaire provided in the embodiments of the present disclosure comprises a reflective and heat-insulating QLED package device and a luminaire body, wherein the reflective and heat-insulating QLED package device is mounted on the luminaire body, and the color rendition effect of as well as the service life of the luminaire can be improved.

BRIEF DESCRIPTION OF THE DRAWINGS

In order to more clearly describe the technical solutions in specific embodiments of the present disclosure or in the prior art, the figures required to be used in the description of the specific embodiments or the prior art will be briefly presented in the following. It is apparent that the figures described below are illustrative of certain embodiments of the present disclosure, and for a person ordinarily skilled in the art, other figures could be obtained according to these figures without inventive efforts.

Reference signs: 100—substrate; 120—reflecting layer; 121—reflecting substance; 122—heat-conducting substance; 130—heat-insulating layer; 140—moisture and oxygen blocking adhesive layer; 200—first LED chip; 300—second LED chip; 400—adhesive layer for quantum dots; 500—reflector cup; 520—junction board; 530—transparent bracket; and 540—glue-injection hole.

DETAILED DESCRIPTION OF THE EMBODIMENTS

In order to make the objects, the technical solutions and the advantages of the embodiments of the present disclosure clearer, the technical solutions in the embodiments of the present disclosure will be clearly and comprehensively described below with reference to the attached figures in the embodiments of the present disclosure. Apparently, the described embodiments are merely some of the embodiments of the present disclosure, rather than all the embodiments. Generally, the assemblies in the embodiments of the present disclosure that are described and shown here in the figures may be arranged and designed according to various configurations.

Thus, the following detailed description of the embodiments of the present disclosure that are provided in the figures merely represents selected embodiments of the present disclosure, rather than being intended to limit the scope of the present disclosure for which protection is sought. Any other embodiments, obtained by a person ordinarily skilled in the art without inventive efforts based on the embodiments in the present disclosure, shall all fall within the scope of protection of the present disclosure.

It is to be noted that similar reference signs and letters represent similar items in the following figures, thus, once a certain item is defined in one figure, no further definition and explanation of this item is necessary in the subsequent figures.

In the description of the present disclosure, it shall be clarified that orientational or positional relations indicated by terms such as "inner" and "lower", are orientational or positional relations shown based on the figures, or orientational or positional relations in which the product of this disclosure is conventionally placed during use, merely for the purpose of facilitating the description of the present disclosure and for simplifying the description, rather than indicating or implying that a specified device or element must have a specific orientation, and be constructed and operated in a certain orientation, and therefore cannot be construed as limiting the present disclosure.

In addition, terms such as "first" and "second" are used merely for purpose of description, and cannot be construed as indicating or implying to have importance in relativity, or implicitly suggesting the number of the indicated technical features. Therefore, a feature defined with a term "first" or "second" can explicitly or implicitly comprise one or more of the features. In the description of the present disclosure, the meaning of the term "a plurality of" indicates two or more, unless otherwise expressly defined.

In the present disclosure, unless otherwise expressly specified and defined, terms such as "mount", "connect", "connection", and "fix" shall be construed in a broad sense. For example, it may be a fixed connection, or a detachable connection, or an integrated connection; it may be a mechanical connection, or an electrical connection; or it may be a direct connection, or an indirect connection via an intermediate, or inner communication between two elements or interactive relation between two elements. For a person ordinarily skilled in the art, the specific meanings of the above-mentioned terms in the present disclosure could be construed in accordance with specific circumstances.

In the following, the present disclosure will be further described in detail according to specific embodiments with reference to the figures. An embodiment of the present disclosure provides a reflective and heat-insulating QLED package device as shown in FIG. 1, comprising a substrate 100, a first LED chip 200 for emitting blue light, a second LED chip 300 for emitting green light, an adhesive layer for quantum dots 400 for emitting red light, a reflecting layer 120 for changing the path of light rays, and a heat-insulating layer 130; wherein the first LED chip 200 and the second LED chip 300 are both arranged on the substrate 100 in a tiled manner, and the distance between the first LED chip 200 and the second LED chip 300 is in a range of 150-500 μm; the heat-insulating layer 130 is arranged on the light output surface of the first LED chip 200 and the light output surface of the second LED chip 300, both the first LED chip 200 and the second LED chip 300 are covered by the reflecting layer 120, the reflecting layer 120 covers the heat-insulating layer 130, and a reflecting substance 121 or a refractive substance is uniformly provided in the reflecting layer 120, such that light rays can uniformly irradiate on the adhesive layer for quantum dots 400, and particles of a heat-conducting substance 122 are further uniformly distributed in the reflecting layer 120; the adhesive layer for quantum dots 400 covers the reflecting layer 120; and the adhesive layer for quantum dots 400 is covered by a moisture and oxygen blocking adhesive layer 140 for protecting quantum dots.

It is to be clarified that: Firstly, a voltage is usually applied to an LED wafer to excite light emission, for the purpose of realizing light emission of the LED chip, for example, in order to make an LED chip emit blue light, a blue-light single crystal wafer can be selected, wherein a voltage is applied to make the same emit blue light. No specific definition is made for the structure and the material of the first LED chip 200 and the second LED chip 300 in the embodiments of the present disclosure, as long as it can make the first LED chip 200 emit blue light and make the second LED chip 300 emit green light. Moreover, the positions, at which the first LED chip 200 and the second LED chip 300 are disposed on the substrate 100, are not limited to the left and right positional relation as shown in FIG. 1, as long as it is ensured that the two LED chips are arranged on the substrate 100 in a tiled manner.

Secondly, the distance between the first LED chip 200 and the second LED chip 300 is set to be between 150-500 μm. It indicates, as shown in FIG. 1, the distance between an edge at the side of the first LED chip 200 adjacent to the second LED chip 300 and an edge at the side of the second LED chip 300 adjacent to the first LED chip 200. If the distance between the first LED chip 200 and the second LED chip 300 is excessively small, the attaching process in the manufacturing process is difficult, and the defective rate is relatively high; and if the distance between the first LED chip 200 and the second LED chip 300 is excessively large, it would easily result in a bad light-mixing effect of light rays emitted by the reflective and heat-insulating QLED package device according to an embodiment of the present disclosure, and the color of light exiting from different positions on the light output surface is not uniform, which adversely affects the display effect.

Figure 1:
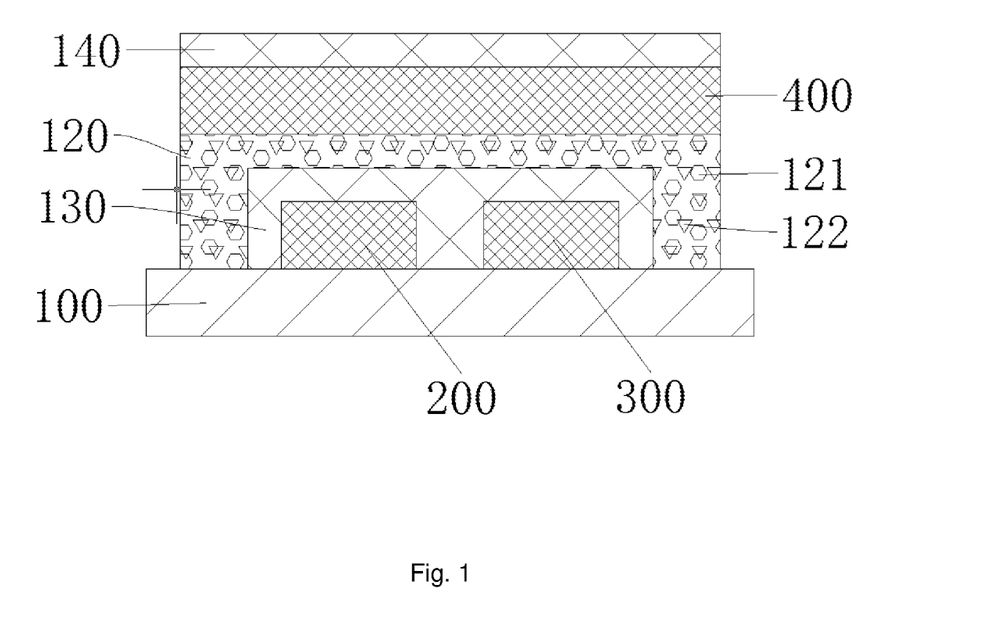
FIG. 1 is a first structural schematic diagram for a reflective and heat-insulating QLED package device provided in an embodiment of the present disclosure.

Thirdly, as shown in FIG. 1, a heat-insulating layer 130 is firstly arranged for covering the light output surface of the first LED chip 200 and the light output surface of the second LED chip 300, and then a reflecting layer 120, an adhesive layer for quantum dots 400 and a moisture and oxygen blocking adhesive layer 140 are successively disposed. On the one hand, the heat-insulating layer 130 can effectively insulate the heat produced by the first LED chip 200 and the second LED chip 300 during the excited light emission process, from transferring towards the reflecting layer 120, and accordingly the transferring into the adhesive layer for quantum dots 400. On the other hand, the reflecting substance 121 or the refractive substance uniformly distributed in the reflecting layer 120 can scatter and mix the blue light emitted by the first LED chip 200 and the green light emitted by the second LED chip 300, such that in the light rays already passed through the reflecting layer 120, the blue light and the green light are mixed and uniformly emerge over the entire surface such as from the adhesive layer for quantum dots 400. Since the reflective and heat-insulating QLED package device according to the present disclosure is used for light emission and emergence, a person skilled in the art would know that for the purpose of ensuring light output efficiency and light output effect, the heat-insulating layer 130, the reflecting layer 120, the adhesive layer for quantum dots 400 and the moisture and oxygen blocking adhesive layer 140, which are arranged in the light output direction of the first LED chip 200 and the second LED chip 300 respectively, are all required to be light transmissive.

Figure 4:
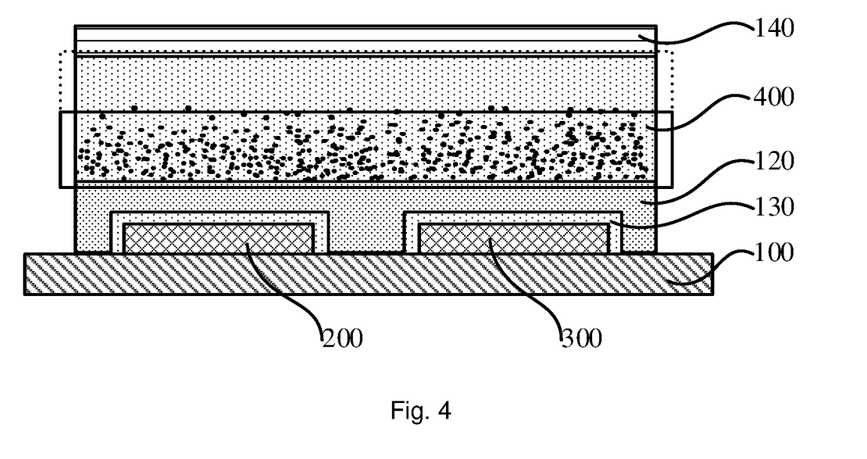
FIG. 4 is a fourth structural schematic diagram for a reflective and heat-insulating QLED package device provided in an embodiment of the present disclosure.

Moreover, since the heat-insulating layer 130 is arranged for the purpose of insulating the heat produced by the first LED chip 200 and the second LED chip 300 during the excited light emission process from transferring towards the reflecting layer 120, and accordingly transferring into the adhesive layer for quantum dots 400, as shown in FIG. 4, the heat-insulating layer 130 may be arranged to only cover the surface of the first LED chip 200 and the surface of the second LED chip 300, and then the reflecting layer 120 is arranged on i.e. the substrate provided with the heat insulating layer 130. In this way, on the one hand, the arrangement of the heat-insulating layer 130 can be realized just by processes of spraying or injection-molding a silicone thin film, without increasing the operation sequence or process difficulty, while the material to be arranged for the heat-insulating layer 130 is economized; and on the other hand, heat produced by the adhesive layer for quantum dots 400 during the excited light emission can be enabled to be transferred downwards through the reflecting layer 120, and heat can be led out through the substrate 100 at the premise of not being blocked by the hear insulating-layer 130, consequently, the heat dissipation effect of the adhesive layer for quantum dots 400 is improved.

Fourthly, the purpose of covering the adhesive layer for quantum dots 400 with the moisture and oxygen blocking adhesive layer 140 is to protect the adhesive layer for quantum dots 400, to minimize the contact between the adhesive layer for quantum dots 400 and ambient air as much as possible, and to reduce the influence on the lifetime of the quantum dots caused by their contact with moisture and oxygen. Thus, the moisture and oxygen blocking adhesive layer 140 shall completely cover the (upper) surface of the adhesive layer for quantum dots 400, and cover all surfaces of the adhesive layer for quantum dots 400 except for the surface thereof which is attached to the reflecting layer 120.

Figure 2:
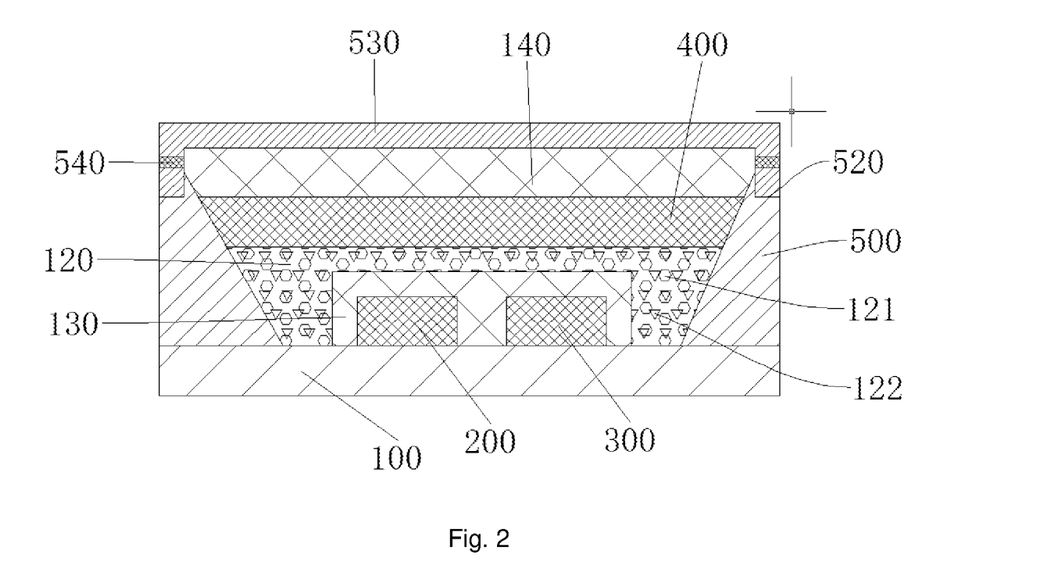
FIG. 2 is a second structural schematic diagram for a reflective and heat-insulating QLED package device provided in an embodiment of the present disclosure.

Fifthly, as shown in FIG. 2, microparticles of a heat-conducting substance 122 are further uniformly distributed in the reflecting layer 120, such that the reflecting layer 120 can also improve the heat dissipation effect, and provide heat produced by an excited adhesive layer for quantum dots 400 with a heat transfer channel to the substrate 100. In this way, heat released by the adhesive layer for quantum dots 400 while being excited to emit light can be well diffused and dissipated by means of the heat conduction realized by the reflecting layer 120, so as to avoid excessive heat accumulation in the adhesive layer for quantum dots 400, which adversely affects the lifetime of the quantum dot substance.

In the above, no specific definition is made in the present disclosure regarding the specific material of the particles of the heat-conducting substance, as long as the substance material has a high coefficient of heat conductivity, a good electrical insulation effect, and a high transmittance or reflectivity for visible light (with a wavelength between 380 nm-780 nm). Exemplarily, the material of the particles of the heat-conducting substance may be selected from any one or more selected from the group consisting of boron nitride, yttrium oxide, magnesia-alumina spinel, magnesium oxide, aluminum oxide and silicon dioxide. Among them, microparticles of boron nitride have a relatively high reflectivity for visible light, and microparticles of yttrium oxide, magnesia-alumina spinel, magnesium oxide, aluminum oxide or silicon dioxide further have a relatively better transmittance for visible light, thus the heat conducting performance can be improved while the reflecting layer 120 maintaining a relatively good reflecting and refracting capabilities of for light rays.

Sixthly, during the use of the reflective and heat-insulating QLED package device according to an embodiment of the present disclosure, a voltage is firstly applied so as to excite the first LED chip 200 and the second LED chip 300 to respectively emit blue light and green light, the blue light and the green light enter the reflecting layer 120 through the heat-insulating layer 130, and after the reflecting effect by the reflecting substance in the reflecting layer 120, the propagation directions of the light rays of the blue light and the green light are changed, such that the blue light and the green light emerging from the reflecting layer 120 are mixed, and the light output directions are diverged. Mixed light rays of the blue light and the green light which are uniformly emerged from the light output surface of the reflecting layer 120 enter the adhesive layer for quantum dots 400, the quantum dots in the adhesive layer for quantum dots 400 are excited to emit red light after absorbing the blue light and the green light, white light is formed by mixing the red light with partial blue light and green light emerging without being absorbed by the quantum dots, and the white light emerges after passing through the moisture and oxygen blocking adhesive layer 140.

An embodiment of the present disclosure provides a reflective and heat-insulating QLED package device, comprising a substrate 100, a first LED chip 200 for emitting blue light, a second LED chip 300 for emitting green light, an adhesive layer for quantum dots 400 for emitting red light, a reflecting layer 120 for changing the path of light rays, and a heat-insulating layer 130; wherein the first LED chip 200 and the second LED chip 300 are both arranged on the substrate 100 in a tiled manner, and the distance between the first LED chip 200 and the second LED chip 300 is in a range of 150-500 μm; the heat-insulating layer 130 is arranged on the light output surface of the first LED chip 200 and the light output surface of the second LED chip 300, both the first LED chip 200 and the second LED chip 300 are covered by the reflecting layer 120, the reflecting layer 120 covers the heat-insulating layer 130, and a reflecting substance 121 or a refractive substance is uniformly distributed in the reflecting layer 120, such that light rays can uniformly irradiate on the adhesive layer for quantum dots 400, and particles of a heat-conducting substance 122 are further uniformly distributed in the reflecting layer 120; the adhesive layer for quantum dots 400 covers the reflecting layer 120; and the adhesive layer for quantum dots 400 is covered by a moisture and oxygen blocking adhesive layer 140 for protecting the quantum dots. A part of the blue light emitted by the first LED chip and the green light emitted by the second LED chip excites quantum dots to emit red light, and white light emerges after that the red light is mixed with the blue light emitted by the first LED chip and the green light emitted by the second LED chip. Because of such mode of the white light emergence, the arrangement of a fluorescent powder layer with relatively wider emission spectrum is cancelled in the structure of the package device, and the overall service life of the LED package device is improved, while the color rendition effect of the LED package device as backlight source is increased. The arrangement of covering the first LED chip and the second LED chip with the heat-insulating layer effectively blocks the heat produced by the LED chips during the light emission process from transferring to the adhesive layer for quantum dots; the light output from the first LED chip and the second LED chip is subjected to dodging and diverging processing by the reflecting layer, such that the density of light received by the adhesive layer for quantum dots is relatively well-balanced; and uniformly distributed particles of a heat-conducting substance enable the reflecting layer to be endowed with a heat dissipation function, and provide heat produced by an excited adhesive layer for quantum dots 400 with a heat transfer channel to the substrate 100, hereby increasing the excitation stability of the adhesive layer for quantum dots and enhancing the reliability of the LED package device.

Optionally, the heat-insulating layer 130 comprises a silicone material layer and microparticles of a reflecting substance 121 or a refractive substance that are uniformly distributed in the silicone material layer.

As shown in FIG. 1, the first LED chip 200 and the second LED chip 300 would generate a large amount of heat and realize heat transfer to the surrounding, when a working voltage is applied thereto for light emission; the adhesive layer for quantum dots 400 arranged in the light output direction of the first LED chip 200 and the second LED chip 300 contains a large amount of quantum dot materials, which would be inactivated when in states of excessively high temperature, excessive light energy absorbed, and contact with moisture and oxygen in air, thereby adversely affecting the working life of the adhesive layer for quantum dots 400, and accordingly adversely affecting the color rendering effect of the reflective and heat-insulating QLED package device according to an embodiment of the present disclosure. The heat-insulating layer 130 is arranged on the first LED chip 200 and the second LED chip 300, and the heat-insulating layer 130 can effectively block the transfer of heat in the light emission direction of the first LED chip 200 and the second LED chip 300, so as to protect the adhesive layer for quantum dots 400 arranged in the light emission direction of the first LED chip 200 and the second LED chip 300.

Exemplarily, a resin material layer having a high moisture and oxygen blocking performance is utilized for the adhesive layer for quantum dots 400, a silicone material layer is utilized for the heat-insulating layer, and a silicone material or silicon resin material layer is utilized for the reflecting layer 120, and microparticles similar to the high molecular material of the adhesive layer for quantum dots 400 are added into the silicone material or silicon resin material layer; and on the basis of the increase in the light transmittance of the silicone material or silicon resin material per se, the adhesion between the interface of the reflecting layer 120 and the interface of the heat-insulating layer 130 as well as the interface of the adhesive layer for quantum dots 400 can further be improved thanks to the mutual conjugation effect of the covalent bonds in the molecular material. In addition, microparticles of the reflecting substance 121 or the refractive substance added into the reflecting layer 120 may be resin microspheres. Utilizing the difference between the refractive index thereof and that of the silicone material or silicon resin material, light rays passing through the reflecting layer 120 can be scattered to a certain degree.

Microparticles of a reflecting substance 121 or a refractive substance are uniformly distributed in the silicone material layer of the heat-insulating layer 130, which also enables the heat-insulating layer 130 to have a certain scattering effect on the passing light rays by means of the distributed microparticles of the reflecting substance 121 or the refractive substance, while the heat-insulating layer 130 blocks the heat produced by the first LED chip 200 and the second LED chip 300 during the light emission process from transferring towards the adhesive layer for quantum dots 400.

Optionally, the diameters of the microparticles of the reflecting substance 121 are between 0.1-1 μm; and the diameters of the microparticles of the refractive substance are between 1-30 μm.

In order to ensure the light transmittance through the heat-insulating layer 130 and at the same time the scattering of light rays by the microparticles of the reflecting substance 121 or the refractive substance, the diameters of the microparticles of the reflecting substance are usually set to be between 0.1-1 μm, and the diameters of the microparticles of the refractive substance are usually set to be between 1-30 μm.

Optionally, as shown in FIG. 4, the adhesive layer for quantum dots 400 comprises a dense region of quantum dots (as shown by the solid box in FIG. 4) and a sparse region of quantum dots (as shown by the dashed box in FIG. 4), with the regions in a stacked structure, wherein the quantum dot density in the dense region of quantum dots is greater than the quantum dot density in the sparse region of quantum dots, and the dense region of quantum dots is located at the side of the adhesive layer for quantum dots 400 adjacent to the heat-insulating layer 130.

Quantum dots are quasi-zero-dimensional nanocrystals with grain diameters between 2-10 nanometers. Each of the quantum dots, when being excited by electricity or light, can emit pure monochromatic light of various different colors and of high quality, according to the diameters of the quantum dots respectively, thus the color rendering effect can be improved. Quantum dots have narrow and symmetrical fluorescence emission peaks, and have no tailing; and an overlap of optical spectra would not easily occur when multi-color quantum dots are used simultaneously, and the color rendering effect can thus be improved. After passing through the reflecting substance 121, light rays excited by the first LED chip 200 and the second LED chip 300 can uniformly irradiate on the quantum dots in the adhesive layer for quantum dots 400, wherein the color rendering effect can be effectively improved by the uniform irradiation.

In order to improve the service life of the quantum dots, the quantum dots are combined into an adhesive layer for quantum dots 400 by utilizing a moisture and oxygen blocking adhesive, wherein the moisture and oxygen blocking adhesive can effectively protect the quantum dot material, thus the quantum dots can work effectively for a long time. Since moisture and oxygen have a relatively large influence on powder material of the quantum dots, and may even cause inactivation of the quantum dots, such an arrangement of combining the quantum dots together by the moisture and oxygen blocking adhesive can make the quantum dot powder function normally for a long time.

Figure 3:
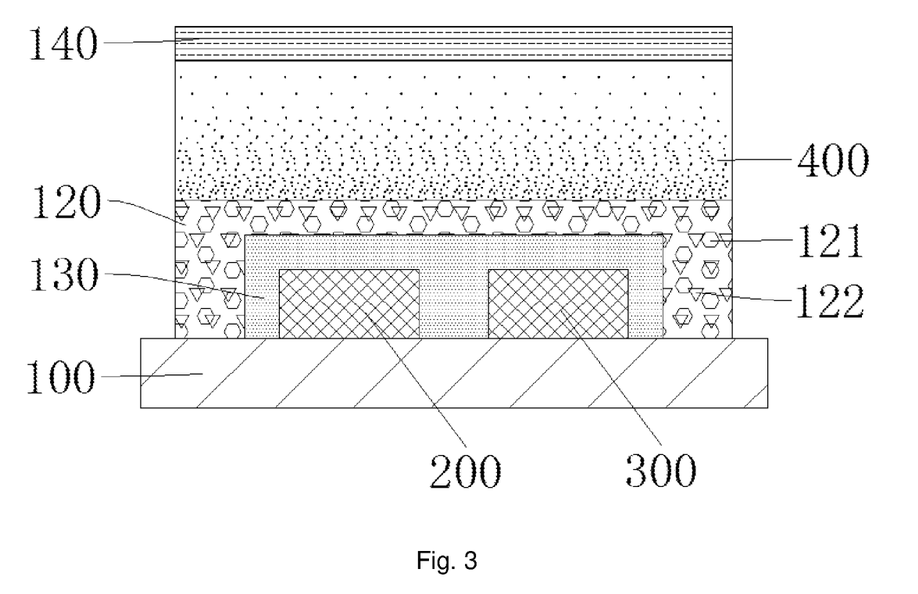
FIG. 3 is a third structural schematic diagram for a reflective and heat-insulating QLED package device provided in an embodiment of the present disclosure.

As shown in FIG. 3, in this way, the substance of the quantum dots in the adhesive layer for quantum dots 400 is concentrated in the dense region of quantum dots as much as possible, and the dense region of quantum dots is located at the side adjacent to the heat-insulating layer 130. In this way, on the basis of being protected by the moisture and oxygen blocking adhesive layer 140, the quantum dot substance can further be protected by the sparse region of quantum dots, hereby reducing the possibility of contact of the quantum dot substance with moisture and oxygen in ambient air, thus improving the service life of the quantum dots and optimizing the display effect.

Optionally, the substrate 100 is provided with a built-in micro-array cavity that is filled with a heat-dissipating working medium, wherein the built-in micro-array cavity is a built-in micro-array cavity made of a heat-dissipating pipeline with a pipe wall thickness of 5 μm.

Optionally, the substrate 100 may be any one selected from the group consisting of aluminum nitride ceramic substrate 100, aluminum oxide ceramic substrate 100, gold substrate 100, silver substrate 100, copper substrate 100, iron substrate 100, gold alloy substrate 100, silver alloy substrate 100, copper alloy substrate 100, iron alloy substrate 100, PPA (Polyphthalamide) substrate 100, PCT (Poly1,4-cyclohexylene dimethylene terephthalate) substrate 100, HTN (High-Temperature-nylonresin) substrate 100, EMC (Epoxy Molding Compound) substrate 100 and SMC (Sheet molding compound) substrate 100.

Optionally, particles of a heat-conducting substance are uniformly distributed in the adhesive layer for quantum dots 400.

In this way, the particles of the heat-conducting substance can enable the adhesive layer for quantum dots 400 per se to have relatively good heat conduction and heat dissipation capabilities, to output in time the heat released by the quantum dot substance while being excited to emit light, hereby avoiding a local overheating of the quantum dot substance, which would adversely affect the lifetime thereof.

Optionally, the first LED chip 200 is welded to the substrate via the bottom thereof; and/or the second LED chip 300 is welded to the substrate 100 via the bottom thereof.

Below, specific description is made with an example where both the first LED chip 200 and the second LED chip 300 are welded to the substrate 100. Specifically, both ends of the bottom of each of the first LED chip 200 and the second LED chip 300 are welded to the substrate 100, and a channel between positive and negative electrodes is formed on the substrate 100 so as to apply a working voltage to the first LED chip 200 and the second LED chip 300. Such a connection mode can improve the functional reliability of the reflective and heat-insulating QLED package device provided in an embodiment of the present disclosure.

Optionally, the diameter of the reflecting substance 121 is usually between 0.1-1 μm.

Specifically, the reflecting substance 121 can uniformly mix the blue light emitted by the first LED chip 200 and the green light emitted by the second LED chip 300, and reflect the same to the adhesive layer for quantum dots 400, hereby avoiding that the efficiency of light emission is adversely affected and lowered because of an excessively large density of received light at local quantum dots on the adhesive layer for quantum dots 400, thereby increasing the service life of the adhesive layer for quantum dots 400, while improving the light emission effect to make the lighting effect closer to that of natural light.

It is to be clarified that in the reflective and heat-insulating QLED package device according to an embodiment of the present disclosure, no specific definition is made regarding the components of the reflecting substance 121 in the reflecting layer 120, as long as the substance material has a good electrical insulation effect and a high transmittance or reflectivity for visible light (with a wavelength between 380 nm-780 nm). Exemplarily, boron nitride, titanium dioxide or the like may be used for the reflecting substance 121, as long as a uniform reflecting effect on incident light beams can be realized.

In addition, a refractive substance can also be added into the reflecting layer 120, wherein the scattering of light beams can be realized by refracting light beams entering the reflecting layer 120. Exemplarily, as mentioned above, the refractive substance may be mesoporous silica or high molecular polymer microspheres that is or are added into the reflecting layer 120 and has or have the capability of refracting light rays.

In an optional solution of an embodiment of the present disclosure, the distance between the first LED chip 200 and the second LED chip 300 is 300 μm. The distance of 300 μm between the first LED chip 200 and the second LED chip 300 can allow the first LED chip 200 and the second LED chip 300 to function normally, and light rays emitted by the two chips can be better mixed.

In order to protect the first LED chip 200, the second LED chip 300 and the adhesive layer for quantum dots 400 and make them work long term, a transparent adhesive layer can further be arranged for covering the hierarchical structure of the reflective and heat-insulating QLED package device according to an embodiment of the present disclosure.

The transparent adhesive layer can better insulate the adhesive layer for quantum dots 400 from air, so as to prevent oxygen and moisture in the air from adversely affecting the performance of the quantum dot substance.

Optionally, as shown in FIG. 2, the substrate 100 is further provided with a reflector cup 500, wherein the reflector cup 500 is arranged at the periphery of the heat-insulating layer 130 and the reflecting layer 120 in a surrounding way.

As shown in FIG. 2, the substrate 100 is further provided with a reflector cup 500, and the reflector cup 500 is arranged at the periphery of the heat-insulating layer 130 and the reflecting layer 120 in a surrounding way. In this way, light rays emerging from a side face of the heat-insulating layer 130 and the reflecting layer 120 can be reflected back into the inside of the device by the provided reflector cup 500, hereby improving the uniformity of the optical radiation of the adhesive layer for quantum dots 400 and increasing the stability of the excited emission of the adhesive layer for quantum dots 400.

On this basis, the height of the reflector cup 500 is 2-3 times of the thickness of each of the first LED chip 200 and the second LED chip 300. It further ensures the light emission angle of the reflective and heat-insulating QLED package device according to an embodiment of the present disclosure, realizing a controllable light pattern and the uniformity of the color of spatially mixed light.

Optionally, as shown in FIG. 2, the top of the reflector cup 500 is provided with a junction board 520.

The junction board 520 is provided at the top of an external wall of the reflector cup 500, and other assemblies may also be provided on the reflector cup 500 via the junction board 520.

As shown in FIG. 2, a stepped board is opened on the top of the external wall of the reflector cup 500, and this stepped board is the junction board 520, wherein when connected with other components, the junction board 520 serves not only for connection, but also for support.

Optionally, the junction board 520 is provided with a transparent bracket 530.

The junction board 520 is provided with a transparent bracket 530, and the transparent bracket 530 is made of a transparent material having a planar shape, a cambered surface or a curved surface, and this material may be selected from the group consisting of optical glass, polyester, polymide, polytetrafluoroethylene or the like. The moisture and oxygen blocking performance is improved, while effectively controlling the shape of the spatial distribution of light energy emitted by the reflective and heat-insulating QLED package device according to an embodiment of the present disclosure. In the above, the adhesive layer for quantum dots 400 may be supported by the transparent bracket 530, and may also be supported by an auxiliary mold base during the package process, d the auxiliary mold base can be removed afterwards.

Optionally, as shown in FIG. 2, side walls of the transparent bracket 530 are provided with a mounting groove and glue-injection holes 540.

During actual use, the transparent bracket 530 can be mounted simply via the mounting groove, and exemplarily, as shown in FIG. 2, two or more glue-injection holes 540 are provided on side walls of the transparent bracket 530 respectively, a resin material having a high moisture and oxygen blocking performance is then injected into a cavity formed by the transparent bracket 530 and the reflector cup 500 through a glue-injection hole 540 on one side, while air is eliminated through the glue-injection hole 540 on other side, hereby forming a filled moisture and oxygen blocking adhesive layer 140. The moisture and oxygen blocking performance is thus further improved, light loss caused by the total reflection of light passing through the contact interface between the air and the plurality of high refractive index materials in the cavity is reduced, and the light output efficiency is improved.

A second aspect of an embodiment of the present disclosure provides another reflective and heat-insulating QLED package device, as shown in FIG. 1, comprising a substrate 100, a first LED chip 200 for emitting blue light, a second LED chip 300 for emitting green light, an adhesive layer for quantum dots 400, a reflecting layer 120 for changing the path of light rays, and a heat-insulating layer 130; wherein the first LED chip 200 and the second LED chip 300 are both arranged on the substrate 100 in a tiled manner, and the distance between the first LED chip 200 and the second LED chip 300 is in a range of 150-200 μm; the heat-insulating layer 130 is arranged on the substrate 100, both the first LED chip 200 and the second LED chip 300 are covered by the reflecting layer 120, the reflecting layer 120 covers the heat-insulating layer 130, and a reflecting substance 121 is uniformly distributed in the reflecting layer 120, such that light rays can uniformly irradiate on the adhesive layer for quantum dots 400; the adhesive layer for quantum dots 400 covers the reflecting layer 120; and the adhesive layer for quantum dots 400 is covered by a moisture and oxygen blocking adhesive layer 140 for protecting quantum dots.

The reflective and heat-insulating QLED package device provided in the second aspect of the present embodiment differs from the reflective and heat-insulating QLED package device according to the foregoing first aspect in that the range of the distance between the first LED chip 200 and the second LED chip 300 is 150-200 μm, and the heat-insulating layer 130 is arranged on the substrate 100, that is, the heat-insulating layer 130 covers the surfaces of the first LED chip 200 and the second LED chip 300, and covers the whole substrate 100, moreover, a reflecting substance 121 is uniformly distributed in the reflecting layer 120. Other structures or components and connection relations as well as package modes are all the same as those in the embodiments for the reflective and heat-insulating QLED package device according to the first aspect. An embodiment of the present disclosure provides a reflective and heat-insulating QLED package device, comprising a substrate 100, a first LED chip 200 for emitting blue light, a second LED chip 300 for emitting green light, an adhesive layer for quantum dots 400 for emitting red light, a reflecting layer 120 for changing the path of light rays, and a heat-insulating layer 130; wherein the first LED chip 200 and the second LED chip 300 are both arranged on the substrate 100 in a tiled manner, and the distance between the first LED chip 200 and the second LED chip 300 is in a range of 150-200 μm; the heat-insulating layer 130 is arranged on the substrate 100, both the first LED chip 200 and the second LED chip 300 are covered by the reflecting layer 120, the reflecting layer 120 covers the heat-insulating layer 130, and a reflecting substance 121 is uniformly distributed in the reflecting layer 120, such that light rays can uniformly irradiate on the adhesive layer for quantum dots 400; the adhesive layer for quantum dots 400 covers the reflecting layer 120; and the adhesive layer for quantum dots 400 is covered by a moisture and oxygen blocking adhesive layer 140 for protecting quantum dots. A part of the blue light emitted by the first LED chip 200 and a part of the green light emitted by the second LED chip 300 excites quantum dots to emit red light, and white light emerges after that the red light is mixed with the blue light emitted by the first LED chip 200 and the green light emitted by the second LED chip 300. Because of such mode of white light emergence, the arrangement of a fluorescent powder layer with relatively wider emission spectrum is cancelled in the structure of the package device, and the overall service life of the LED package device is improved, while the color rendition effect of the LED package device as backlight source is increased. The heat-insulating layer 130 effectively blocks the heat produced by the LED chip during the light emission process from transferring to the adhesive layer for quantum dots 400; the light output from the first LED chip 200 and the second LED chip 300 is subjected to dodging and diverging processing by the reflecting layer 120, such that the density of light received by the adhesive layer for quantum dots 400 is relatively well-balanced, hereby increasing the excitation stability of the adhesive layer for quantum dots 400 and enhancing the reliability of the LED package device.

Optionally, the heat-insulating layer 130 comprises a silicone material layer and microparticles of a reflecting substance 121 or a refractive substance that are uniformly distributed in the silicone material layer.

Optionally, particles of a heat-conducting substance 122 are further uniformly distributed in the reflecting layer 120.

Optionally, the adhesive layer for quantum dots 400 comprises a dense region of quantum dots and a sparse region of quantum dots in a stacked structure, wherein the quantum dot density in the dense region of quantum dots is greater than the quantum dot density in the sparse region of quantum dots, and the dense region of quantum dots is located at the side of the adhesive layer for quantum dots adjacent to the heat-insulating layer.

Optionally, particles of the heat-conducting substance 122 are uniformly distributed in the adhesive layer for quantum dots 400.

Optionally, the first LED chip 200 is welded to the substrate 100 via the bottom thereof; and/or the second LED chip 300 is welded to the substrate 100 via the bottom thereof.

Optionally, the diameters of the microparticles of the reflecting substance 121 are set to be between 0.1-1 μm, and the diameters of the microparticles of the refractive substance are set to be between 1-30 μm.

Optionally, the substrate 100 is further provided with a reflector cup 500, wherein the reflector cup 500 is arranged at the periphery of the heat-insulating layer 130 and the reflecting layer 120 in a surrounding way.

Optionally, the top of the reflector cup 500 is provided with a junction board 520.

Optionally, the junction board 520 is provided with a transparent bracket 530.

Optionally, a mounting groove is provided on an inner wall of the transparent bracket 530.

Optionally, glue-injection holes 540 are provided on side walls of the transparent bracket 530 respectively.

Further refined or optimized structures and working principle of the reflective and heat-insulating QLED package device according to the foregoing second aspect are the same as those of the reflective and heat-insulating QLED package device according to the first aspect, and since the description of the reflective and heat-insulating QLED package device according to the first aspect is made specifically in the embodiments, no repetitive description will be made herein.

Figure 5:
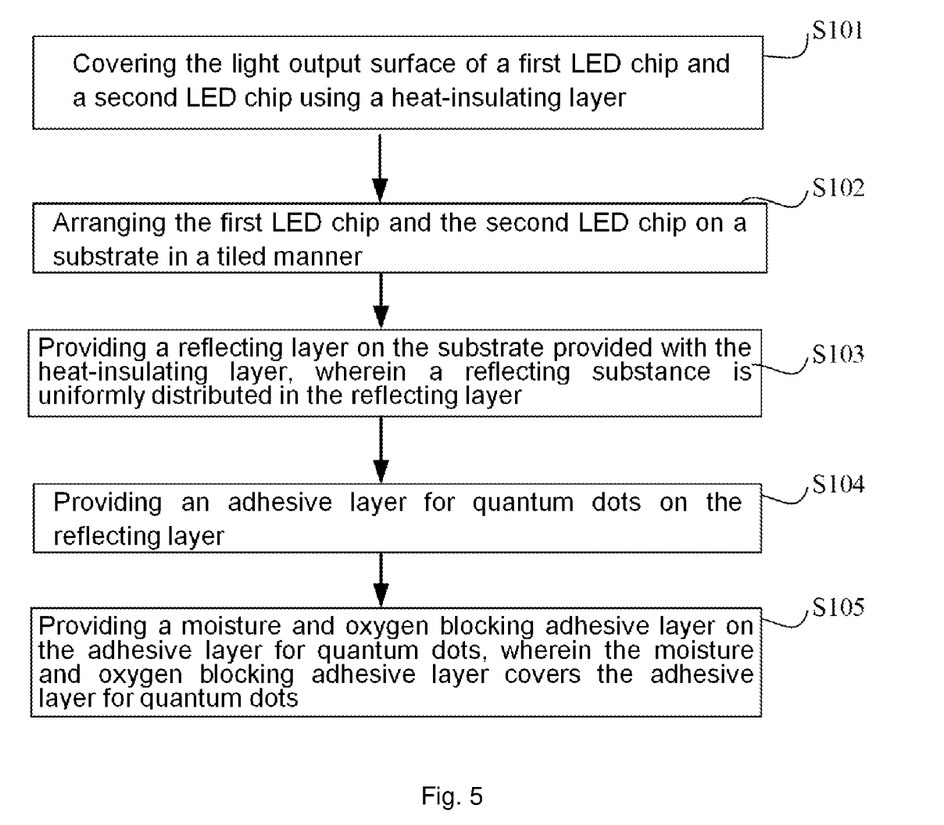
FIG. 5 is a first flow chart of a method for packaging a reflective and heat-insulating QLED package device provided in an embodiment of the present disclosure.

A third aspect of an embodiment of the present disclosure provides a method for packaging a reflective and heat-insulating QLED package device, as shown in FIG. 5, comprising steps of:

S101: covering the light output surface of a first LED chip 200 and the light output surface of a second LED chip 300 using a heat-insulating layer 130.

S102: arranging the first LED chip 200 and the second LED chip 300 on a substrate 100 in a tiled manner.

S103: providing a reflecting layer 120 on the substrate 100 provided with the heat-insulating layer 130, wherein a reflecting substance 121 is uniformly distributed in the reflecting layer 120.

S104: providing an adhesive layer for quantum dots 400 on the reflecting layer 120.

S105: providing a moisture and oxygen blocking adhesive layer 140 on the adhesive layer for quantum dots 400, wherein the moisture and oxygen blocking adhesive layer 140 covers the adhesive layer for quantum dots 400.

As shown in FIG. 5, a heat-insulating layer 130 is firstly arranged for covering the light output surface of the first LED chip 200 and the light output surface of the second LED chip 300, which allows the heat produced by the adhesive layer for quantum dots 400 during excited light emission to be transferred downwards through the reflecting layer 120, and heat can be outputted through the substrate 100, without being blocked by the heat-insulating layer 130, thus the heat dissipation effect of the adhesive layer for quantum dots 400 is improved.

Then, the first LED chip 200 and the second LED chip 300 which are covered by the heat-insulating layer 130 are arranged on the substrate 100 in a tiled manner, and a channel between positive and negative electrodes is formed on the substrate 100 to apply a working voltage to the first LED chip 200 and the second LED chip 300. Herein, the heat-insulating layer 130 at least covers the light output surface of the first LED chip 200 and the light output surface of second LED chip 300, that is, the heat-insulating layer 130 may cover partial surface of the substrate 100, including covering the surfaces of the first LED chip 200 and the second LED chip 300, or as shown in FIG. 4, the heat-insulating layer 130 may only cover the surfaces of the first LED chip 200 and the second LED chip 300.

With the arrangement of the reflecting layer 120 on the substrate 100 provided with the heat-insulating layer 130 and with the uniform distribution of a reflecting substance 121 or a refractive substance in the reflecting layer 120, light rays entering the reflecting layer 120 can emerge after multiple times of reflections and refractions; as for the light rays emerging from the reflecting layer 120, the blue light and the green light respectively emitted by the first LED chip 200 and the second LED chip 300 can be mixed and uniformly emerge through the light output surface of the reflecting layer 120.

With the arrangement of the adhesive layer for quantum dots 400 on the reflecting layer 120, light rays, which emerge from the light output surface of the reflecting layer 120 and in which blue light and green light are relatively uniformly mixed, enter the adhesive layer for quantum dots 400 and excite the quantum dots to emit light, hereby avoiding an excessively high density of light in the direction perpendicular to the first LED chip 200 and the second LED chip 300, and avoiding affecting on the activity and the lifetime of the quantum dots due to their excessive light absorption at corresponding positions. Since the activity and lifetime of the quantum dot substance in the adhesive layer for quantum dots 400 will also be adversely affected due to its contact with moisture and oxygen in air, a moisture and oxygen blocking adhesive layer 140 covering the whole adhesive layer for quantum dots 400 is provided on the adhesive layer for quantum dots 400, so as to provide the quantum dot substance with a protection blocking moisture and oxygen.

Particles of a heat-conducting substance are further uniformly distributed in the reflecting layer 120.

Particles of a heat-conducting substance being uniformly distributed in the reflecting layer 120, allows the reflecting layer 120 to improve the heat dissipation effect as well. In this way, heat released by the adhesive layer for quantum dots 400 while being excited, can be well diffused and dissipated by means of the heat conduction realized by the reflecting layer 120, so as to avoid excessive heat accumulated in the adhesive layer for quantum dots 400 and avoid adversely affecting the lifetime of the quantum dot substance. Likewise, no specific definition is made in the embodiments of the present disclosure regarding the mode of distributing particles of a heat-conducting substance in the reflecting layer 120, and a person skilled in the art could add the setting of this processing step according to specific technological process. Exemplarily, while a reflecting substance 121 is uniformly distributed in the reflecting layer 120, particles of a heat-conducting substance can also be uniformly distributed.

Optionally, the reflecting layer 120 comprises a silicone material layer in which resin microparticles are uniformly distributed.

A silicone material or silicon resin material layer is utilized for the reflecting layer 120, and microparticles similar to the high molecular material of the adhesive layer for quantum dots 400 are added into the silicone material or silicon resin material layer; and on the basis of the increase in the light transmittance of the silicone material or silicon resin material per se, the adhesion between the interface of the reflecting layer 120 and the interface of the heat-insulating layer 130 as well as the interface of the adhesive layer for quantum dots 400 can further be improved thanks to the mutual conjugation effect of the covalent bonds in the molecular material. In addition, resin microparticles added into the reflecting layer 120 may be resin microspheres. Utilizing the difference between the refractive index thereof and that of the silicone material or silicon resin material, light rays passing through the reflecting layer 120 can be scattered to a certain degree.

Optionally, the heat-insulating layer 130 further comprises microparticles of a refractive substance 121 or a reflecting substance that are uniformly distributed in the silicone material layer.

Microparticles of a refractive substance 121 or a reflecting substance being uniformly distributed in the silicone material layer of the heat-insulating layer 130 enables the heat-insulating layer 130 to have a certain scattering effect on the penetrating light rays by means of the distributed microparticles of the refractive substance 121 or the reflecting substance, while the heat-insulating layer 130 blocks the heat produced by the first LED chip 200 and the second LED chip 300 during the light emission process from transferring towards the adhesive layer for quantum dots 400. It is to be clarified that in order to ensure the light transmittance through the heat-insulating layer 130 and at the same time the scattering of light rays by the microparticles of the refractive substance 121 or the reflecting substance the diameters of the microparticles of the reflecting substance are usually set to be between 0.1-1 μm, and the diameters of the microparticles of the refractive substance is usually set to be between 1-30 μm. In the above, No specific definition is made in the embodiments of the present disclosure regarding the mode of distributing particles of a refractive substance 121 or a reflecting substance in the heat-insulating layer 130, and a person skilled in the art could add the setting of this processing step according to specific technological process.

Figure 6:
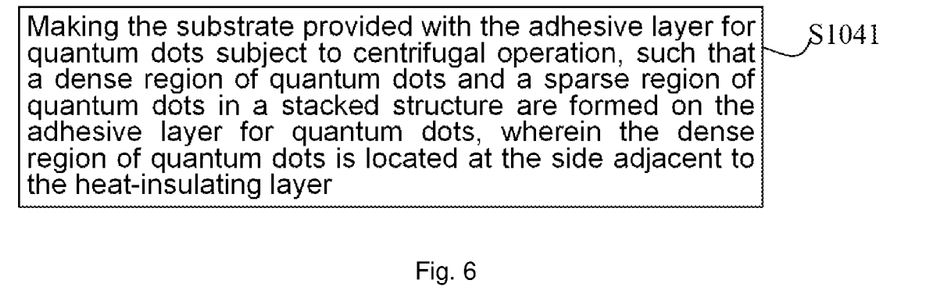
FIG. 6 is a second flow chart of a method for packaging a reflective and heat-insulating QLED package device provided in an embodiment of the present disclosure.

Optionally, as shown in FIG. 6, after step S104, the method according to the embodiment of the present disclosure further comprises:

S1041: making the substrate 100 provided with the adhesive layer for quantum dots 400 subject to a centrifugal operation, such that a dense region of quantum dots and a sparse region of quantum dots are formed on the adhesive layer for quantum dots 400, with the regions in a stacked structure, wherein the dense region of quantum dots is located at the side adjacent to the heat-insulating layer 130.

As shown in FIG. 6, the adhesive layer for quantum dots 400 to subjected to the centrifugal operation, such that the quantum dot substance in the adhesive layer for quantum dots 400 is converged towards one side of the adhesive layer for quantum dots 400, so as to form a dense region of quantum dots and a sparse region of quantum dots in a stacked structure, wherein the dense region of quantum dots is provided to be located at the side adjacent to the heat-insulating layer 130. In this way, a mass of converged quantum dot substance can further be protected by the sparse region of quantum dots, hereby improving the insulating effect between the quantum dot substance and moisture as well as oxygen, and prolonging the service life of the adhesive layer for quantum dots 400. Moreover, the density distribution of the quantum dot substance in the adhesive layer for quantum dots 400 is realized by centrifugation, and only a centrifuge is required for operations, which means that the process is simple, easy to implement, and has a good centrifugal effect.

Optionally, microparticles of a heat-conducting substance 122 are uniformly distributed in the adhesive layer for quantum dots 400.

The particles of a heat-conducting substance can enable the adhesive layer for quantum dots 400 per se to have relatively good heat conduction and heat dissipation capabilities, and output heat released by the quantum dot substance in time while being excited to emit light, hereby avoiding a local overheating of the quantum dot substance, which would adversely affect the lifetime. No specific definition is made in the embodiments of the present disclosure regarding the mode of distributing particles of a heat-conducting substance in the adhesive layer for quantum dots 400, and a person skilled in the art could add the setting of this processing step according to specific technological process.

It is to be clarified: If the adhesive layer for quantum dots 400 is further subjected to the centrifugal operation in step S1041, the processing step of uniformly distributing the particles of a heat-conducting substance in the adhesive layer for quantum dots 400 may be performed after step S1041, as the particles of the heat-conducting substance need to be uniformly distributed in the adhesive layer for quantum dots 400.

Optionally, the heat-insulating layer 130 on the substrate 100 is formed by an injection molding process or a film spraying process; and the reflecting layer 120, the adhesive layer for quantum dots 400 and the moisture and oxygen blocking adhesive layer 140 are formed by glue dispensing or spraying process.

A gelatinous film layer may be formed by film pressing using an injection molding machine, or a gelatinous film layer may be formed by atomization of spraying, or a gelatinous film layer can be formed by coating using glue dispensing, thus the manufacturing method is simple and easy to operate, and the shaping effect is good; and the yield of the reflective and heat-insulating QLED package devices manufactured with the package method according to an embodiment of the present disclosure can also be increased while the manufacturing process is simplified, which facilitates batch production, reduces production costs and shortens production time.

A fourth aspect of an embodiment of the present disclosure provides a luminaire, comprising a reflective and heat-insulating QLED package device according to any item of the foregoing first aspect and a luminaire body; wherein the reflective and heat-insulating QLED package device is mounted on the luminaire body.

A fifth aspect of an embodiment of the present disclosure provides a luminaire, comprising a reflective and heat-insulating QLED package device according to any item of the foregoing second aspect and a luminaire body; wherein the reflective and heat-insulating QLED package device is mounted on the luminaire body.

The luminaire provided in an embodiment of the present disclosure can improve the color rendering effect and the service life, and has the advantages of high efficiency of light emission, wide color gamut coverage and long service life compared with a luminaire according to the prior art. In the foregoing specific embodiments, the structure, the working principle and the beneficial effects of the reflective and heat-insulating QLED package device are described in detail, and no repetitive description will be made herein. In the depiction of the present description, depiction referring to terms such as "an embodiment", "some embodiments", "an example", "specific example" or "some examples" indicates that specific features, structures, materials or characteristics depicted in combination with this embodiment or example are included in at least one embodiment or example of the present disclosure. In the present description, schematic expressions of the above-mentioned terms do not necessarily indicate same embodiment or example. Moreover, the depicted specific features, structures, materials or characteristics can be combined in any one or more embodiments or examples in a suitable way. In addition, without causing any contradictory, a person skilled in the art could integrate and combine different embodiments or examples depicted in the present description and features of different embodiments or examples with each other.

The above mentioned is merely preferred embodiments of the present disclosure, and is not intended to limit the present disclosure, and for a person skilled in the art, the present disclosure may be modified and changed in various ways. Any modifications, equivalent substitutions and improvements made within the spirit and principle of the present disclosure shall all be covered in the scope of protection of the present disclosure.

INDUSTRIAL APPLICABILITY

The present disclosure provides a reflective and heat-insulating QLED package device and a method for packaging the same as well as a luminaire, such that the arrangement of a fluorescent powder layer with relatively wider emission spectrum is cancelled in the structure of the package device, hereby realizing a better displayed white light emergence, and the overall efficiency of light emission and the service life of a backlight module composed of the LED package device is improved, while the display effect with the wide color gamut of the LED package device is increased.

The invention claimed is:

1. A reflective and heat-insulating QLED (Quantum Dot Light Emitting Diode) package device, comprising a substrate, a first LED chip for emitting blue light, a second LED chip for emitting green light, an adhesive layer for quantum dots, a reflecting layer for changing a path of light rays, and a heat-insulating layer,
    wherein the first LED chip and the second LED chip are both arranged on the substrate in a tiled manner, and a distance between the first LED chip and the second LED chip is between 150-500 μm;
    the heat-insulating layer is arranged on a light output surface of the first LED chip and a light output surface of the second LED chip, both the first LED chip and the second LED chip are covered by the reflecting layer, the reflecting layer covers the heat-insulating layer, and a reflecting substance or a refractive substance is uniformly distributed in the reflecting layer, such that light rays can uniformly irradiate on the adhesive layer for quantum dots, and particles of a heat-conducting substance are further uniformly distributed in the reflecting layer;
    the adhesive layer for quantum dots covers the reflecting layer; and
    the adhesive layer for quantum dots is covered by a moisture and oxygen blocking adhesive layer for protecting quantum dots.

2. The reflective and heat-insulating QLED package device according to claim 1, wherein the heat-insulating layer comprises a silicone material layer, and microparticles of the refractive substance or the reflecting substance that are uniformly distributed in the silicone material layer.

3. The reflective and heat-insulating QLED package device according to claim 1, wherein the adhesive layer for quantum dots comprises a dense region of quantum dots and a sparse region of quantum dots, with the regions in a stacked structure, wherein a quantum dot density in the dense region of quantum dots is greater than a quantum dot density in the sparse region of quantum dots, and the dense region of quantum dots is located at a side of the adhesive layer for quantum dots adjacent to the heat-insulating layer.

4. The reflective and heat-insulating QLED package device according to claim 1, wherein the particles of the heat-conducting substance are uniformly distributed in the adhesive layer for quantum dots.

5. The reflective and heat-insulating QLED package device according to claim 1, wherein the first LED chip is welded to the substrate via a bottom of the first LED chip; and/or the second LED chip is welded to the substrate via a bottom of the second LED chip.

6. The reflective and heat-insulating QLED package device according to claim 1, wherein diameters of the microparticles of the reflecting substance are set to be between 0.1-1 μm, and diameters of the microparticles of the refractive substance are set to be between 1-30 μm.

7. The reflective and heat-insulating QLED package device according to claim 1, wherein the substrate is further provided with a reflector cup, the reflector cup is arranged at a periphery of the heat-insulating layer and the reflecting layer, in a surrounding way.

8. The reflective and heat-insulating QLED package device according to claim 7, wherein a top of the reflector cup is provided with a junction board.

9. The reflective and heat-insulating QLED package device according to claim 8, wherein the junction board is provided with a transparent bracket.

10. The reflective and heat-insulating QLED package device according to claim 9, wherein a mounting groove is provided on an inner wall of the transparent bracket.

11. The reflective and heat-insulating QLED package device according to claim 10, wherein glue-injection holes are provided on side walls of the transparent bracket respectively.

12. A luminaire, comprising the reflective and heat-insulating QLED package device according to claim 1 and a luminaire body,
wherein the reflective and heat-insulating QLED package device is mounted on the luminaire body.

13. The reflective and heat-insulating QLED package device according to claim 2, wherein the adhesive layer for quantum dots comprises a dense region of quantum dots and a sparse region of quantum dots, with the regions in a stacked structure, wherein a quantum dot density in the dense region of quantum dots is greater than a quantum dot density in the sparse region of quantum dots, and the dense region of quantum dots is located at a side of the adhesive layer for quantum dots adjacent to the heat-insulating layer.

14. The reflective and heat-insulating QLED package device according to claim 2, wherein the particles of the heat-conducting substance are uniformly distributed in the adhesive layer for quantum dots.

15. A method for packaging a reflective and heat-insulating QLED package device, comprising steps of:
covering a light output surface of a first LED chip and a light output surface of a second LED chip, using a heat-insulating layer;
arranging the first LED chip and the second LED chip on a substrate in a tiled manner;
providing a reflecting layer on the substrate provided with the heat-insulating layer, wherein a reflecting substance is uniformly distributed in the reflecting layer;
providing an adhesive layer for quantum dots on the reflecting layer; and
providing a moisture and oxygen blocking adhesive layer on the adhesive layer for quantum dots, wherein the moisture and oxygen blocking adhesive layer covers the adhesive layer for quantum dots.

16. The method for packaging a reflective and heat-insulating QLED package device according to claim 15, wherein the heat-insulating layer comprises a silicone material layer and microparticles of a reflecting substance or a refractive substance that are uniformly distributed in the silicone material layer.

17. The method for packaging a reflective and heat-insulating QLED package device according to claim 15, wherein particles of the heat-conducting substance are further uniformly distributed in the reflecting layer.

18. The method for packaging a reflective and heat-insulating QLED package device according to claim 15, wherein after the step of providing an adhesive layer for quantum dots on the reflecting layer, the method further comprises a step of:
making the substrate provided with the adhesive layer for quantum dots subject to centrifugal operation, such that a dense region of quantum dots and a sparse region of quantum dots are formed on the adhesive layer for quantum dots, with the regions in a stacked structure, wherein the dense region of quantum dots is located at the side adjacent to the heat-insulating layer.

19. The method for packaging a reflective and heat-insulating QLED package device according to claim 18, wherein the particles of the heat-conducting substance are uniformly distributed in the adhesive layer for quantum dots.

20. The method for packaging a reflective and heat-insulating QLED package device according to claim 15, wherein the heat-insulating layer on the substrate is formed by an injection molding process or a film spraying process; and the reflecting layer, the adhesive layer for quantum dots and the moisture and oxygen blocking adhesive layer are formed through a glue dispensing or spraying process.

\* \* \* \* \*